US006822491B1

(12) United States Patent
Glass

(10) Patent No.: US 6,822,491 B1
(45) Date of Patent: Nov. 23, 2004

(54) FREQUENCY PRESCALER APPARATUS, METHOD, AND SYSTEM

(75) Inventor: Kevin W. Glass, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/608,051

(22) Filed: Jun. 27, 2003

(51) Int. Cl.[7] .............................................. H03K 21/00
(52) U.S. Cl. ...................................... 327/115; 377/48
(58) Field of Search ................................ 327/115, 117, 327/147, 156, 155, 1; 331/17, 25; 375/373, 375, 376; 377/48, 47

(56) References Cited

U.S. PATENT DOCUMENTS

| 4,648,103 A | * | 3/1987 | Welty et al. .................. 377/52 |
| 4,777,655 A | * | 10/1988 | Numata et al. ............... 455/76 |
| 5,969,548 A | * | 10/1999 | Knapp .......................... 327/117 |
| 6,411,669 B1 | * | 6/2002 | Kim ............................ 377/48 |

OTHER PUBLICATIONS

Chae, Kwan–Yeob , et al., "Double Precharge TSPC for High–Speed Dual Modulus Prescaler", *IEEE*, (1999),pp. 609–612.

Chang, W–H , et al., "A Low–Power and Low–Noise CMOS Prescaler for 900 MHz to 1.9 GHz Wireless Applications", *IEEE 1999 Custom Integrated Circuits Conference*, (1999), pp. 597–600.

Chi, Baoyong , et al., "2/3 Divider Cell Using Phase Switching Technique", *Electronics Letters*, vol. 37, (Jul. 2001),pp. 875–877.

De Muer, Bram , et al., "A CMOS Monolithic Δ Σ–Controlled Fractional–N Frequency Synthesizer for DCS–1800", *IEEE Journal of Solid–State Circuits*, vol. 37,(Jul. 2002),pp. 835–844.

Dulger, Fikret , et al., "Design Considerations in a BiCMOS Dual–Modulus Prescaler", *2002 IEEE Radio Frequency Integrated Circuits Symposium*, (2002),pp. 177–180.

Hsu, June–Ming , et al., "Low–Voltage CMOS Frequency Synthesizer for ERMES Pager Application", *IEEE Transactions on Circuits and Systems—II: Analog and Digital Signal Processing*, vol. 48,(2001),pp. 826–834.

Hung, Chih–Ming , et al., "A Fully Integrated 1.5–V 5.5–GHz CMOS Phase–Locked Loop", *IEEE Journal of Solid–State Circuits*, vol. 37,(Apr. 2002),pp. 521–525.

Hung, Chih–Ming , et al., "Fully Integrated 5.35–GHz CMOS VCOs and Prescalers", *IEEE Transactions on Microwave Theory and Techniques*, vol. 49,(Jan. 2001),pp. 17–22.

Knapp, Herbert , et al., "2–GHz/2–mW and 12–GHz/ 30–m/W Dual Modulus Prescalers in Silicon Bipolar Technology", *IEEE Journal of Solid–State Circuits*, vol. 36,(Sep. 2001),pp. 1420–1423.

Knapp, Herbert , et al., "36 GHz Dual–Modulus Prescaler in SiGe Bipolar Technology", *2002 IEEE Radio Frequency Integrated Circuits Symposium*, (2002),pp. 239–242.

Lee, Kang–Yoon , et al., "Full–CMOS 2.4GHz Wideband CDMA Transmitter and Receiver with Direct Conversion Mixers and DC–Offset Cancellation", *2001 Symposium on VLSI Circuits Digest of Technical Papers*, (2001),pp. 7–10.

(List continued on next page.)

*Primary Examiner*—Linh My Nguyen
(74) *Attorney, Agent, or Firm*—LeMoine Patent Services, PLLC

(57) ABSTRACT

A frequency prescaler includes an asynchronous counter having a least significant stage clocked by an input signal, and a first true single phase clock flip-flop having an input stage with an embedded logic gate to decode a state of the asynchronous counter, configured to modify a modulus of the asynchronous counter.

25 Claims, 10 Drawing Sheets

OTHER PUBLICATIONS

Maligeorgos, James P., et al., "A Low–Voltage 5.1–5.8–GHz Image–Reject Receiver with Wide Dynamic Range", *IEEE Journal of Solid–State Circuits*, vol. 35,(Dec. 2000),pp. 1917–1926.

Ohira, Takashi , et al., "An X–Band GaAs Monolithic Voltage Controlled Frequency Divider with Ultra–Low DC Power Consumption", *Proceedings of APMC*, (2001),pp. 127–130.

Pretl, Harald , et al., "A W–CDMA Zero–IF Front–End for UMTS in a 75 GHz SiGe BiCMOS Technology", *2001 IEEE Radio Frequency Integrated Circuits Symposium*, (2001),pp. 9–12.

Soares, Jr., J N., et al., "A 1.6–GHz Dual Modulus Prescaler Using the Extended True–Single–Phase–Clock CMOS Circuit Technique (E–TSPC)", *IEEE Journal of Solid–State Circuits*, vol. 34,(Jan. 1999),pp. 97–102.

Soares, Jr., Joao N., et al., "The Use of Extended TSPC CMOS Structures to Build Circuits with Doubled Input/Output Data Throughput", *IEEE*, (2000),pp. 228–233.

Sung, Ki–Hyuk , et al., "Comments on 'New Dynamic Flip–Flops for High–Speed Dual–Modulus Prescaler'", *IEEE Transactions on Solid–State Cicuits*, vol. 35,(Jun. 2000),pp. 919–920.

Tiebout, Marc , "A 480µW 2GHZ Ultra Low Power Dual–Modulus Prescaler in 0.25µM Standard CMOS", *IEEE International Symposium on Circuits and Systems*, (May 2000),pp. 741–744.

Tournier, Eric , et al., "A 14.5 GHz–0.35µm Frequency Divider for Dual–Modulus Prescaler", *2002 IEEE Radio Frequency Integrated Circuits Symposium*, (2002),pp. 227–230.

Wassatsch, Andreas , et al., "Scalable Counter Architecture for a Preloadable 1GHz@0.6µm/5V Prescaler in TSPC", *IEEE*, (2001),pp. 92–95.

Wu, Ping , et al., "A CMOS Triple–band Fractional–N Frequency Synthesizer for GSM/GPRS/EDGE Applications", *IEEE*, (2001),pp. 706–709.

Yan, Hongyan , et al., "A High–Speed CMOS Dual–Phase Dynamic–Psuedo NMOS ((DP)$^2$) Latch and Its Application in a Dual–Modulus Prescaler", *IEEE Journal of Solid–State Circuits*, vol. 34,(Oct. 1999),pp. 1400–1404.

Yuan, J–R , et al., "Fast CMOS Nonbinary Divider and Counter", *Electronics Letters*, vol. 29,(Jun. 1993),pp. 1222–1223.

Yuan, J–R , et al., "New Domino Logic Prechanged by Clock and Data", *Electronics Letters*, vol. 29,(Dec. 1993), pp. 2188–2189.

Yuan, Jiren , et al., "Pushing the Limits of Standard CMOS", *IEEE Spectrum*, (Feb. 1991),pp. 52–53.

Yun, Wonjoo , et al., "New High Speed Dynamic D–Type Flip Flop For Prescaler", *ISIE 2001*, (2001),pp. 629–631.

\* cited by examiner

US 6,822,491 B1

FREQUENCY PRESCALER APPARATUS, METHOD, AND SYSTEM

FIELD

The present invention relates generally to frequency divider circuits, and more specifically to digital frequency divider circuits.

BACKGROUND

Many applications exist for frequency synthesizers. For example, in communications systems, frequency synthesizers can be used to generate local oscillator (LO) signals for modulating and demodulating radio frequency (RF) signals. In these systems, the RF signals can be varied in frequency by varying the frequency of the LO signals.

A frequency synthesizer with a variable output frequency may utilize a feedback loop circuit that includes frequency divider circuits, or "prescalers." A frequency prescaler typically employs a combination of sequential elements and digital logic to provide a variable amount of frequency division. For example, a frequency prescaler may be configured to divide a reference signal by a factor of 4 or by a factor of 5 using flip-flops and digital logic gates. By varying the amount of frequency division provided by the prescaler, the synthesizer output frequency can be varied.

Any given frequency synthesizer has a maximum frequency at which it will reliably operate. This maximum frequency is dependent on many factors, including the topology of the circuit, the underlying manufacturing process, and the maximum operating frequency of the prescaler. If a faster prescaler is available, this may increase the maximum operating frequency of the frequency synthesizer.

For the reasons stated above, and for other reasons stated below which will become apparent to those skilled in the art upon reading and understanding the present specification, there is a need in the art for alternate frequency division mechanisms.

DESCRIPTION OF EMBODIMENTS

Figure 1:
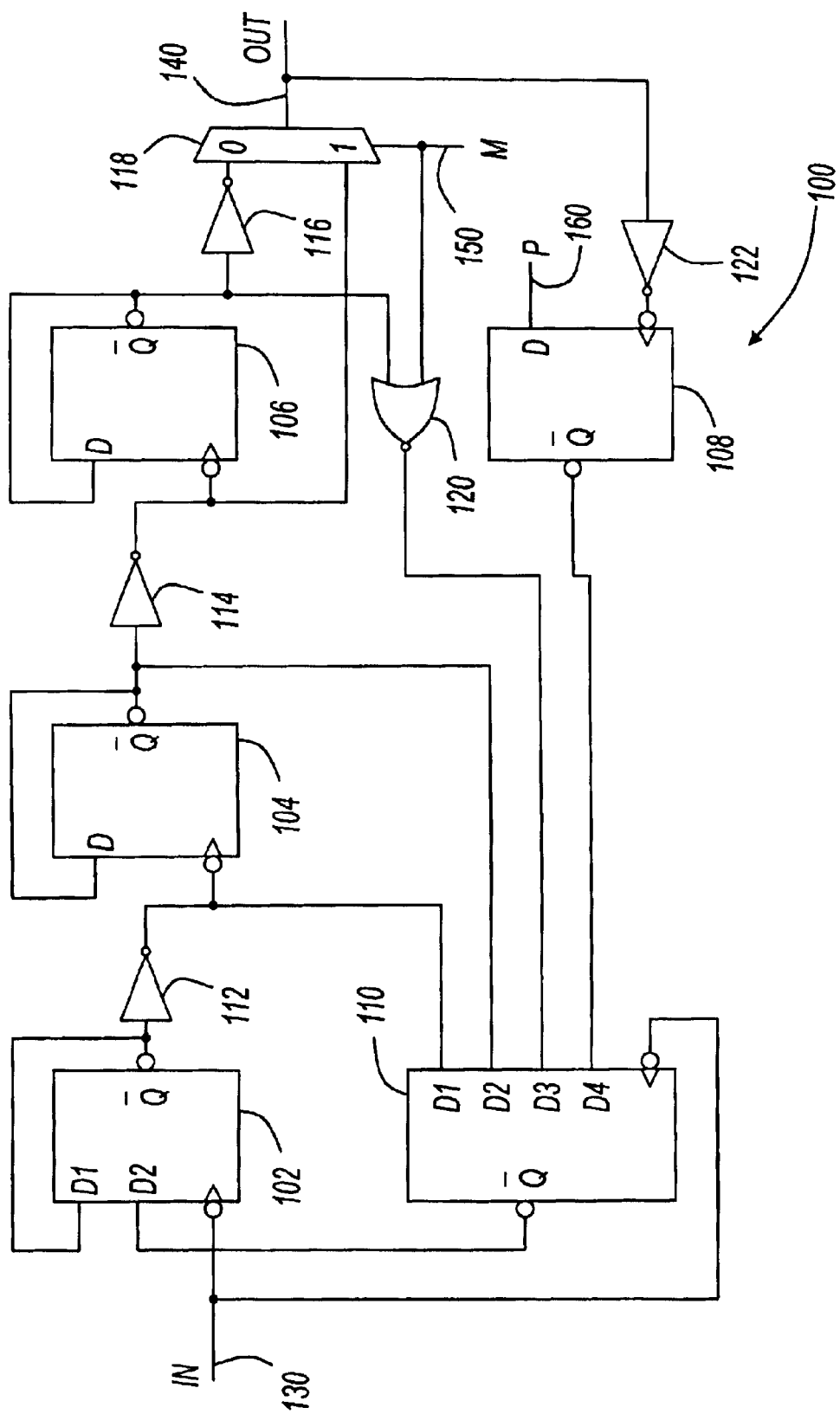
FIG. 1 shows a diagram of a prescaler.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of a prescaler. Prescaler 100 includes flip-flops 102, 104, 106, 108, and 110, inverters 112, 114, 116, and 122, multiplexer 118, and NOR gate 120. Flip-flops 102, 104, and 106 form an asynchronous counter. Flip-flop 102 forms a least significant stage of the asynchronous counter, and flip-flop 106 forms a most significant stage of the asynchronous counter. The counter is referred to as asynchronous because each of the flip-flops in the counter are not clocked by a common clock signal. Rather, each successively more significant stage of the counter is clocked by an output signal from a less significant stage.

Flip-flops 104 and 106 are configured as divide-by-two circuits, in part because the D input is coupled to the inverted output. Flip-flop 102 is also coupled as a divide-by-two circuit, but the divide-by-two action is gated by the second D-input shown as "D2" in FIG. 1. Flip-flop 102 is an example of a sequential element having a logic gate embedded within an input stage. An example of flip-flop 102 is shown in more detail in FIG. 3.

Flip-flop 110 also includes embedded logic in an input stage. Flip-flop 110 receives four input signals on input nodes shown as D1, D2, D3, and D4, and produces an inverted output. In some embodiments, the embedded logic gate in the input stage of flip-flop 10 may be a four input OR gate. Flip-flop 10 is an example of a decoder flip-flop that uses an embedded logic gate to decode the state of the asynchronous counter and other signals, and gate the input to flip-flop 102. An example of flip-flop 110 is shown in more detail in FIG. 4.

In operation, prescaler 100 receives a signal on node 130, and produces an output signal on node 140. Prescaler 100 also receives a signal "M" on node 150 and a signal "P" on node 160. Prescaler 100 divides the frequency of the input signal based on the values of M and P, and produces the output signal having a lower frequency than the input signal.

Prescaler 100 may operate in one of two modes as determined by the state of the M (mode) signal: a 4/5 mode, or an 8/9 mode. When M is set to a logical "1," prescaler 100 operates in the 4/5 mode, and when M is set to a logical "0," prescaler 100 operates in the 8/9 mode. In the 4/5 mode, prescaler 100 divides the frequency of the input signal by either four or five. In the 8/9 mode, prescaler 100 divides the frequency of the input signal by either eight or nine.

In the 4/5 mode, multiplexer 118 selects the output of inverter 114 to provide the output signal on node 140. Also in 4/5 mode, NOR gate 120 removes the effects of flip-flop 106 from the counter decoding performed by flip-flop 110. In this mode, the state of the "P" signal determines whether prescaler 100 divides by four or divides by five. When P is set to a logical "0," prescaler 100 divides by four, and when P is set to a logical "1," prescaler 100 divides by five.

In the 8/9 mode, multiplexer 118 selects the output of inverter 116 to provide the output signal on node 140. Also in 8/9 mode, NOR gate 120 allows the output of flip-flop 106 to be included in the counter decoding performed by flip-flop 110. In this mode, the state of the "P" signal determines whether prescaler 100 divides by eight or divides by nine. When P is set to a logical "0," prescaler 100 divides by eight, and when P is set to a logical "1," prescaler 100 divides by nine.

Prescaler 100 is an example of an "even/odd" modulus prescaler that can function in one of two even/odd modes: 4/5, and 8/9. The M control signal selects between the different even/odd modes. The P control signal conditionally lengthens the period of the asynchronous counter by one period of the input signal to modify the modulus of the counter between an even and an odd modulus.

In some embodiments, more sequential elements are added to the prescaler to provide even/odd modes other than 4/5 or 8/9. For example, in some embodiments, prescalers provide even/odd modes of 16/17 and 32/33. Any even/odd mode may be provided by a prescaler without departing from the scope of the present invention.

Figure 2:
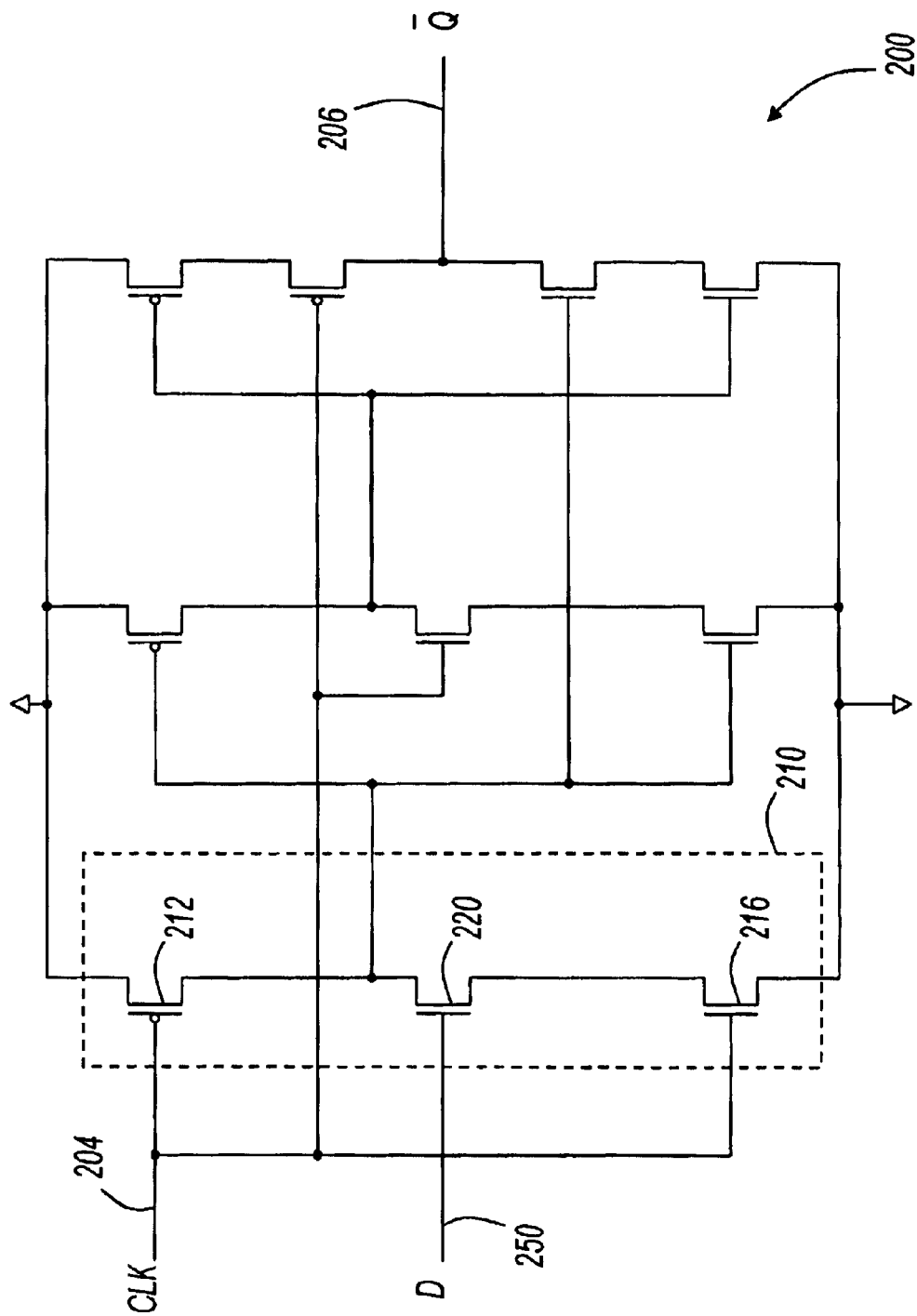
FIG. 2 shows a circuit schematic of a sequential element.

FIG. 2 shows a circuit schematic of a sequential element. Sequential element 200 is referred to as a true-single-phase-clock (TSPC) flip-flop, in part because it responds to a single clock signal rather than two clock signals with different phases. Sequential element 200 includes input stage 210 that receives an input signal on a "D" input node and a clock signal on a "CLK" input node. CLK input node 204 is coupled to gates of transistors 212 and 216, and D input node 250 is coupled to the gate of transistor 220. An inverted output is provided at output node 206.

In some embodiments, sequential element 200 is used for one or more of flip-flops 104, 106, and 108 (FIG. 1). For example, when sequential element 200 is used for flip-flop 104, CLK input node 204 may be coupled to the output of inverter 112 (FIG. 1), and D input node 250 may be coupled to output node 206.

Figure 3:
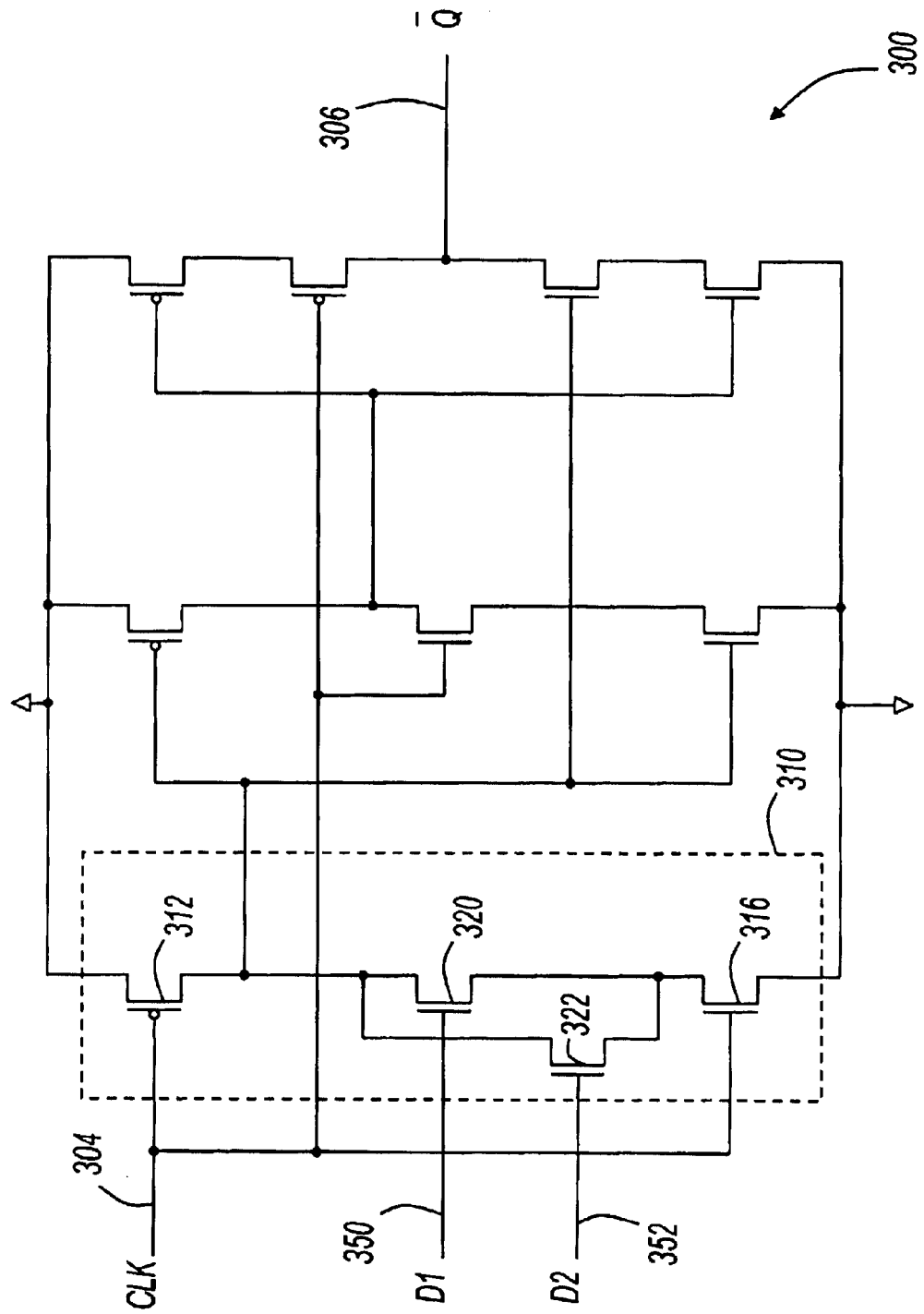
FIGS. 3 and 4 show circuit schematics of sequential elements with embedded logic.
Figure 4:
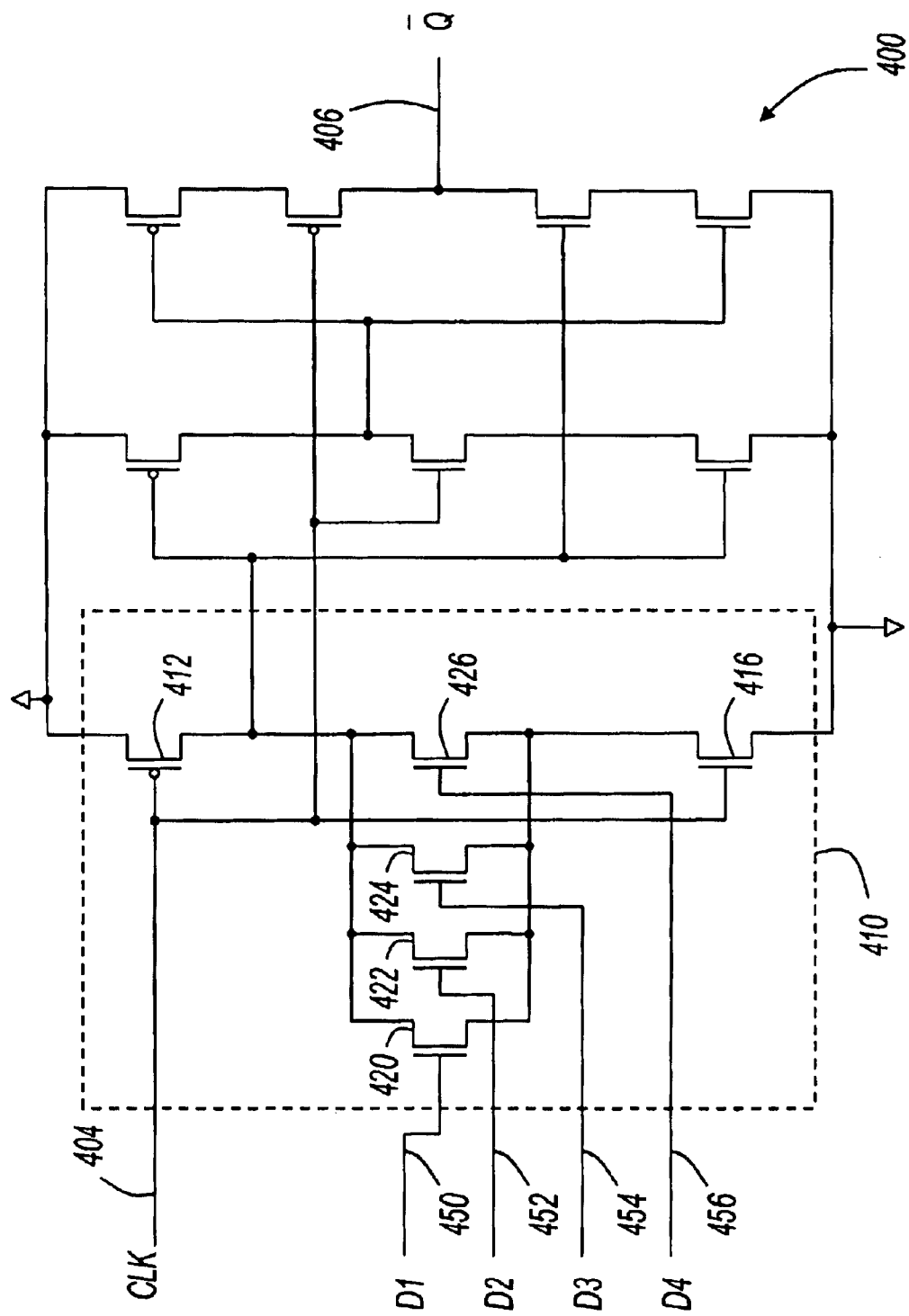

FIGS. 3 and 4 show circuit schematics of sequential elements with embedded logic. Referring first to FIG. 3, sequential element 300 includes input stage 310 that receives input signals on two input nodes: "D1" and "D2." Input stage 310 also receives a clock signal on a "CLK" input node. CLK input node 304 is coupled to gates of transistors 312 and 316, D1 input node 350 is coupled to the gate of transistor 320, and D2 input node 352 is coupled to the gate of transistor 322. An inverted output is provided at output node 306.

Sequential element 300 includes a logic gate embedded in the input stage. For example, transistors 320 and 322 form an OR gate embedded within input stage 310. In some embodiments, sequential element 300 is used for flip-flop 102 (FIG. 1). For example, when sequential element 300 is used for flip-flop 102, D1 input node 350 may be coupled to output node 306, D2 input node 352 may be coupled to the output of flip-flop 110, and CLK input node 304 may be coupled to input node 130.

Referring now to FIG. 4, sequential element 400 includes input stage 410 that receives input signals on four input nodes: "D1," "D2," "D3," and "D4." Input stage 410 also receives a clock signal on a "CLK" input node. CLK input node 404 is coupled to gates of transistors 412 and 416, D1 input node 450 is coupled to the gate of transistor 420, D2 input node 452 is coupled to the gate of transistor 422, D3 input node 454 is coupled to the gate of transistor 424, and D4 input node 456 is coupled to the gate of transistor 426. An inverted output is provided at output node 406.

Sequential element 400 includes a logic gate embedded in the input stage. For example, transistors 420, 422, 424, and 426 form a four input OR gate embedded within input stage 410. In some embodiments, sequential element 400 is used for flip-flop 110 (FIG. 1). For example, when sequential element 400 is used for flip-flop 110, D1 input node 450 may be coupled to the output of inverter 112, D2 input node 452 may be coupled to the output of flip-flop 104, D3 input node 454 may be coupled to the output of NOR gate 120, D4 input node 456 may be coupled to the output of flip-flop 108, and CLK input node 404 may be coupled to input node 130.

The transistors shown in FIGS. 2-4 (and later figures) are shown as isolated gate transistors, and specifically as metal oxide semiconductor field effect transistors (MOSFETs). For example, transistors 212, 312, and 412 are shown as P-type MOSFETs, and transistors 216, 316, and 416 are shown as N-type MOSFETs. Other types of switching or amplifying elements may be utilized for the various transistors described herein, without departing from the scope of the present invention. For example, the transistors may be junction field effect transistors (JFETs), bipolar junction transistors (BJTs), or any device capable of performing as described herein.

Figure 5:
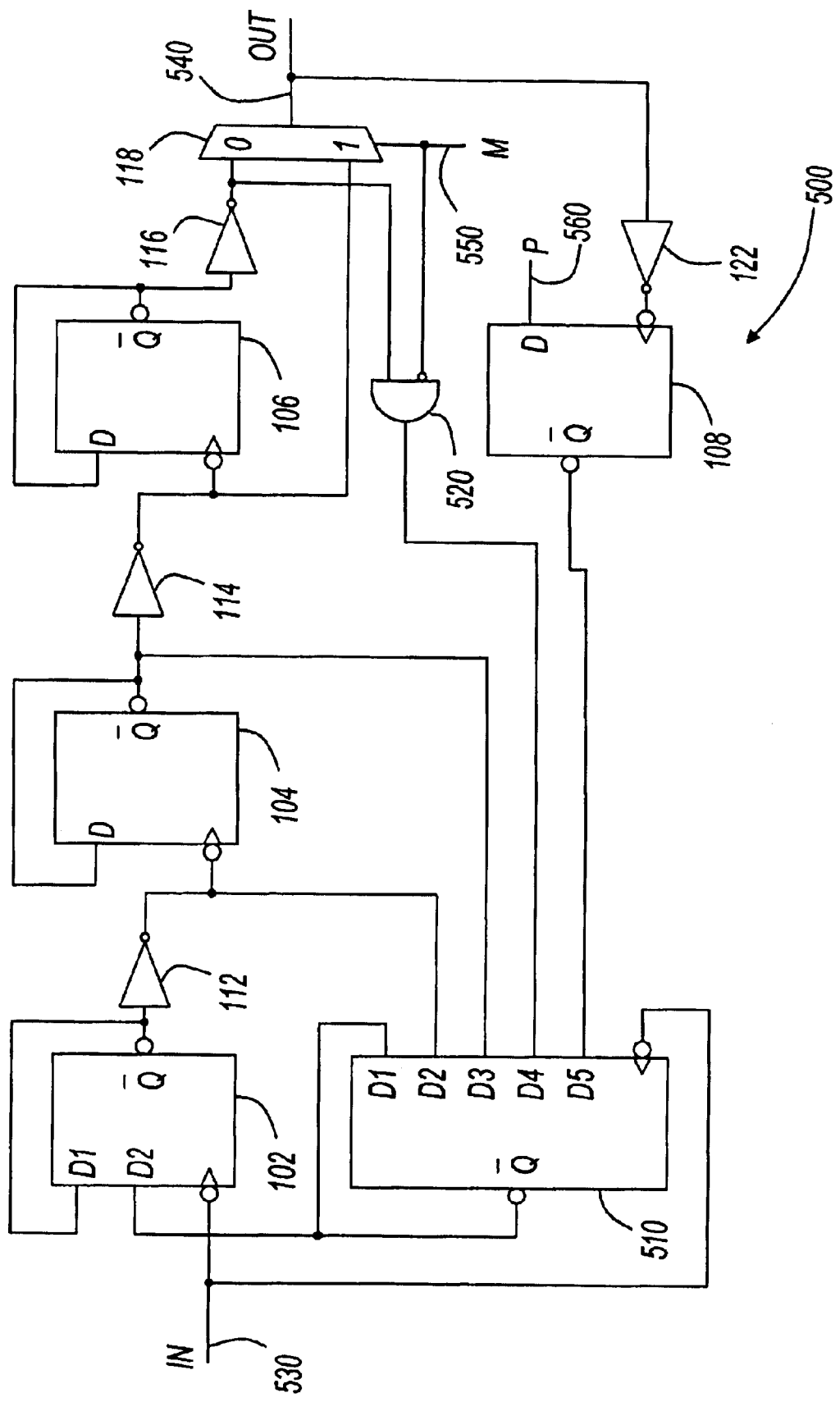
FIGS. 5 and 6 show diagrams of prescalers.
Figure 6:
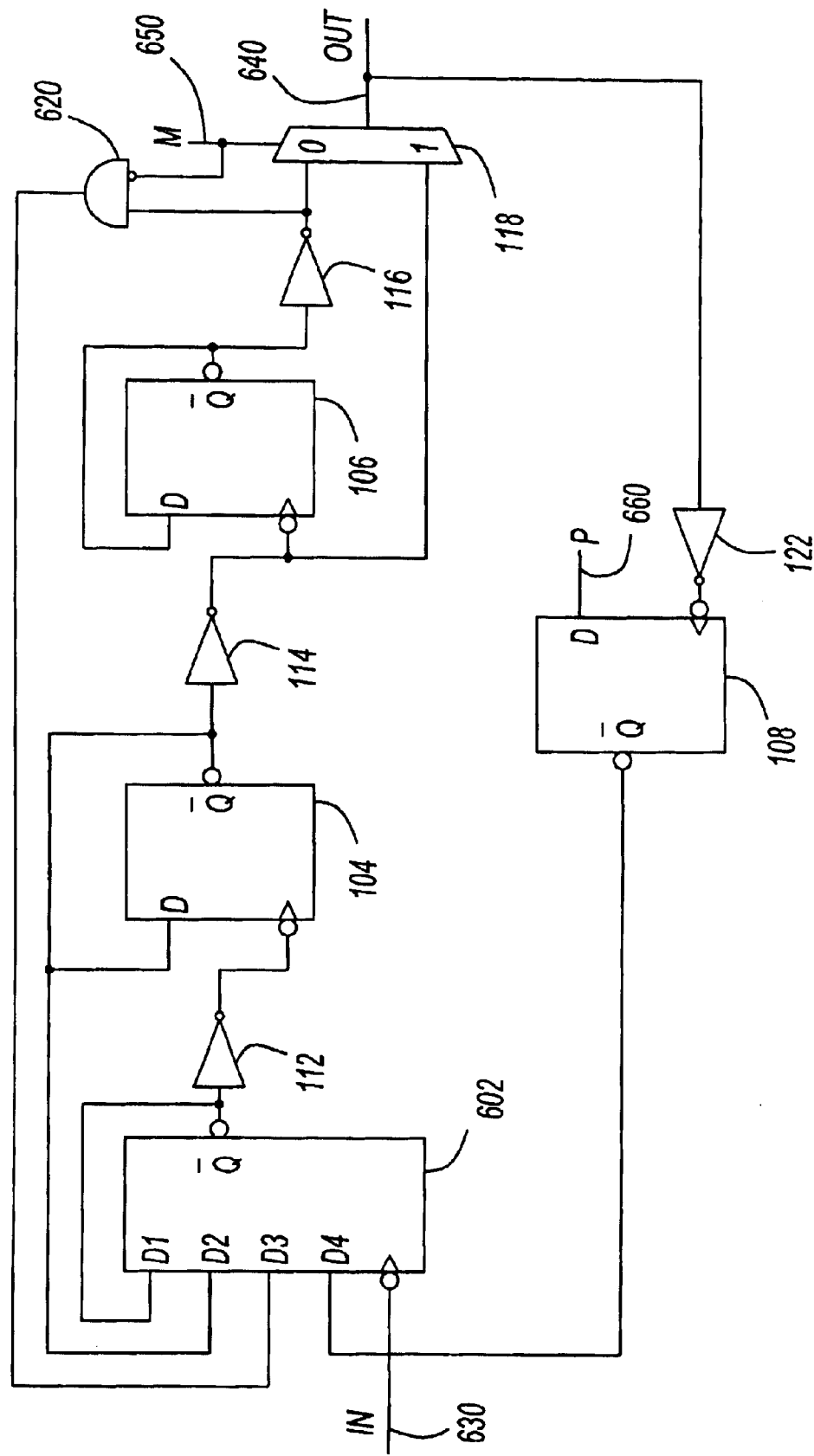

FIGS. 5 and 6 show diagrams of prescalers. Referring now to FIG. 5, prescaler 500 includes flip-flops 102, 104, 106, 108, and 510, inverters 112, 114, 116, and 122, multiplexer 118, and logic gate 520. As in prescaler 100 (FIG. 1) flip-flops 102, 104, and 106 form an asynchronous counter. Flip-flop 102 forms a least significant stage of the asynchronous counter, and flip-flop 106 forms a most significant stage of the asynchronous counter. Flip-flops 104 and 106 are configured as divide-by-two circuits, in part because the D input is coupled to the inverted output. Flip-flop 102 is also coupled as a divide-by-two circuit, but the divide-by-two action is gated by the second D input shown as "D2" in FIG. 5. Flip-flop 102 is an example of a sequential element having a logic gate embedded within an input stage. An example of flip-flop 102 is shown in more detail in FIG. 3.

Flip-flop 510 also includes embedded logic in an input stage. Flip-flop 510 receives five input signals on input nodes shown as D1, D2, D3, D4, and D5, and produces an inverted output. In some embodiments, the embedded logic gate in the input stage of flip-flop 510 may be a five input OR gate. Flip-flop 510 is an example of a decoder flip-flop that uses an embedded logic gate to decode the state of the asynchronous counter and other signals, and gate the input to flip-flop 102. In some embodiments, flip-flop 510 may be implemented similar to sequential element 400 (FIG. 4) with an additional transistor in parallel with transistors 420, 422, 424, and 426.

In operation, prescaler 500 receives a signal on node 530, and produces an output signal on node 540. Prescaler 500 also receives a signal "M" on node 550 and a signal "P" on node 560. Prescaler 500 divides the frequency of the input signal based on the values of M and P, and produces the output signal having a lower frequency than the input signal.

Prescaler 500 may operate in one of two modes as determined by the state of the M (mode) signal: a 4/5 mode, or an 8/9 mode. When M is set to a logical "1," prescaler 500 operates in the 4/5 mode, and when M is set to a logical "0," prescaler 500 operates in the 8/9 mode. In the 4/5 mode, prescaler 500 divides the frequency of the input signal by either four or five. In the 8/9 mode, prescaler 500 divides the frequency of the input signal by either eight or nine.

In the 4/5 mode, multiplexer 118 selects the output of inverter 114 to provide the output signal on node 140. Also in 4/5 mode, logic gate 520 removes the effects of flip-flop 106 from the counter decoding performed by flip-flop 510.

In this mode, the state of the "P" signal determines whether prescaler 500 divides by four or divides by five. When P is set to a logical "0," prescaler 500 divides by four, and when P is set to a logical "1," prescaler 500 divides by five.

In the 8/9 mode, multiplexer 118 selects the output of inverter 116 to provide the output signal on node 540. Also in 8/9 mode, logic gate 520 allows the output of flip-flop 106 to be included in the counter decoding performed by flip-flop 510. In this mode, the state of the "P" signal determines whether prescaler 500 divides by eight or divides by nine. When P is set to a logical "0," prescaler 500 divides by eight, and when P is set to a logical "1," prescaler 500 divides by nine.

Prescaler 500 is an example of an "even/odd" modulus prescaler that can function in one of two even/odd modes: 4/5, and 8/9. The M control signal selects between the different even/odd modes. The P control signal conditionally lengthens the period of the asynchronous counter by one period of the input signal to modify the modulus of the counter between an even and an odd modulus.

In some embodiments, more sequential elements are added to the prescaler to provide even/odd modes other than 4/5 or 8/9. For example, in some embodiments, prescalers provide even/odd modes of 16/17 and 32/33. Any even/odd mode may be provided by a prescaler without departing from the scope of the present invention.

Referring now to FIG. 6, prescaler 600 includes flip-flops 602, 104, 106, and 108, inverters 112, 114, 116, and 122, multiplexer 118, and logic gate 620. Flip-flops 602, 104, and 106 form an asynchronous counter. Flip-flop 602 forms a least significant stage of the asynchronous counter, and flip-flop 106 forms a most significant stage of the asynchronous counter. Flip-flops 104 and 106 are configured as divide-by-two circuits, in part because the D input is coupled to the inverted output. Flip-flop 602 is also coupled as a divide-by-two circuit, but the divide-by-two action is gated by other signals received by flip-flop 602. Flip-flop 602 is an example of a sequential element having a logic gate embedded within an input stage. The embedded logic gate decodes the state of the asynchronous counter, receives control signal information, and conditionally allows flip-flop 602 to perform a divide-by-two operation. An example of flip-flop 602 is shown in more detail in FIG. 7.

In operation, prescaler 600 receives a signal on node 630, and produces an output signal on node 640. Prescaler 600 also receives a signal "M" on node 650 and a signal "P" on node 660. Prescaler 600 divides the frequency of the input signal based on the values of M and P, and produces the output signal having a lower frequency than the input signal.

Prescaler 600 may operate in one of two modes as determined by the state of the M (mode) signal: a 4/5 mode, or an 8/9 mode. When M is set to a logical "1," prescaler 600 operates in the 4/5 mode, and when M is set to a logical "0," prescaler 600 operates in the 8/9 mode. In the 4/5 mode, prescaler 600 divides the frequency of the input signal by either four or five. In the 8/9 mode, prescaler 600 divides the frequency of the input signal by either eight or nine.

In the 4/5 mode, multiplexer 118 selects the output of inverter 114 to provide the output signal on node 640. Also in 4/5 mode, logic gate 620 removes the effects of flip-flop 106 from the counter decoding performed by flip-flop 602. In this mode, the state of the "P" signal determines whether prescaler 600 divides by four or divides by five. When P is set to a logical "0," prescaler 600 divides by four, and when P is set to a logical "1," prescaler 600 divides by five.

In the 8/9 mode, multiplexer 118 selects the output of inverter 116 to provide the output signal on node 640. Also in 8/9 mode, logic gate 620 allows the output of flip-flop 106 to be included in the counter decoding performed by flip-flop 602. In this mode, the state of the "P" signal determines whether prescaler 600 divides by eight or divides by nine. When P is set to a logical "0," prescaler 600 divides by eight, and when P is set to a logical "1," prescaler 600 divides by nine.

Prescaler 600 is an example of an "even/odd" modulus prescaler that can function in one of two even/odd modes: 4/5, and 8/9. The M control signal selects between the different even/odd modes. The P control signal conditionally lengthens the period of the asynchronous counter by one period of the input signal to modify the modulus of the counter between an even and an odd modulus.

In some embodiments, more sequential elements are added to the prescaler to provide even/odd modes other than 4/5 or 8/9. For example, in some embodiments, prescalers provide even/odd modes of 16/17 and 32/33. Any even/odd mode may be provided by a prescaler without departing from the scope of the present invention.

Figure 7:
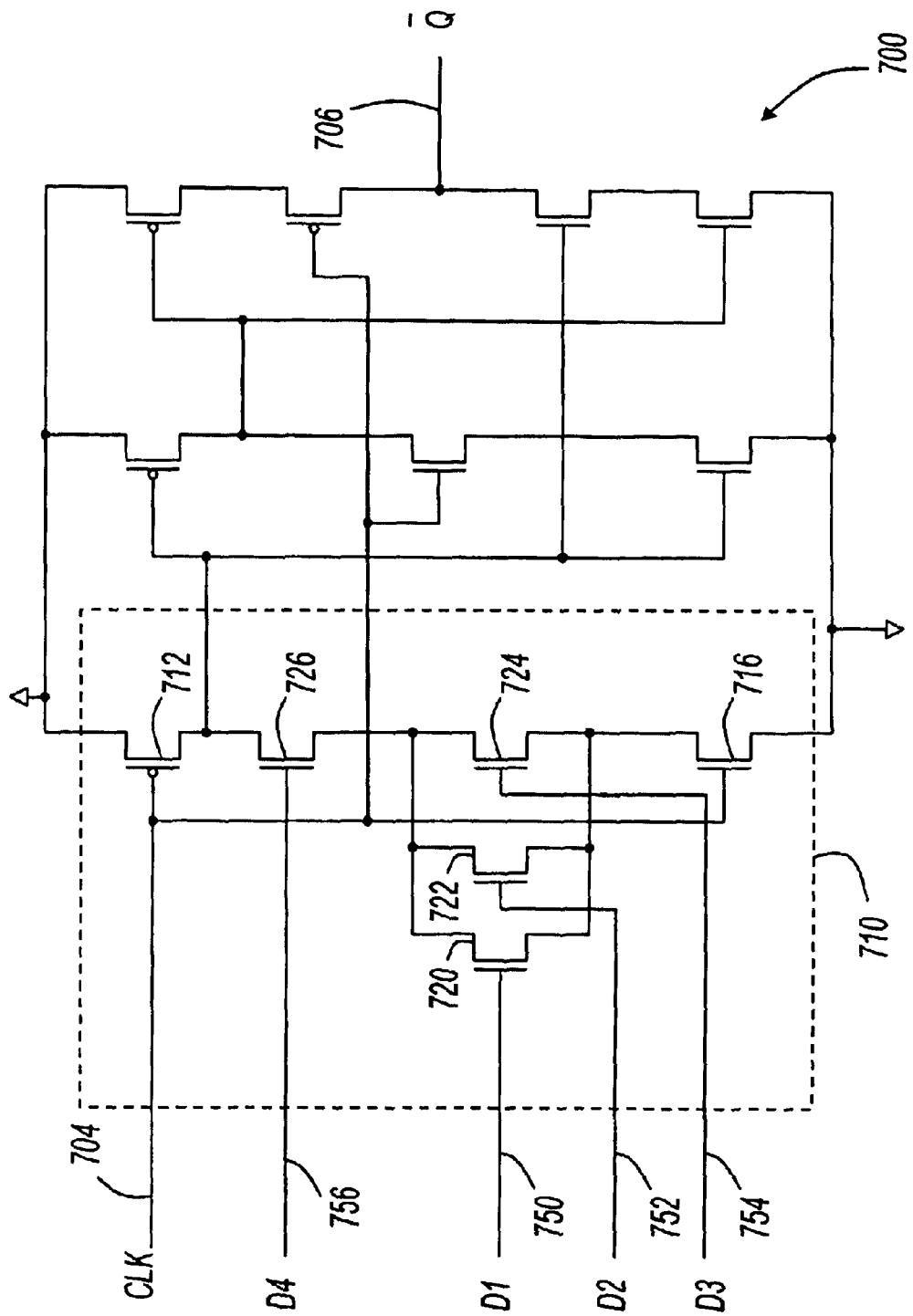
FIG. 7 shows a circuit schematic of a sequential element with embedded logic.

FIG. 7 shows a circuit schematic of a sequential element with embedded logic. Sequential element 700 includes input stage 710 that receives input signals on four input nodes: "D1," "D2," "D3," and "D4." Input stage 710 also receives a clock signal on a "CLK" input node. CLK input node 704 is coupled to gates of transistors 712 and 716, D1 input node 750 is coupled to the gate of transistor 720, D2 input node 752 is coupled to the gate of transistor 722, D3 input node 754 is coupled to the gate of transistor 724, and D4 input node 756 is coupled to the gate of transistor 726. An inverted output is provided at output node 706.

Sequential element 700 includes a logic gate embedded in the input stage. For example, transistors 720, 722, 724, and 726 form a combination OR-AND gate embedded within input stage 710. In some embodiments, sequential element 700 is used for flip-flop 602 (FIG. 6). For example, when sequential element 700 is used for flip-flop 602, D1 input node 750 may be coupled to output node 706, D2 input node 752 may be coupled to the output of flip-flop 104, D3 input node 754 may be coupled to the output of logic gate 620, D4 input node 756 may be coupled to the output of flip-flop 108, and CLK input node 704 may be coupled to input node 630.

Figure 8:
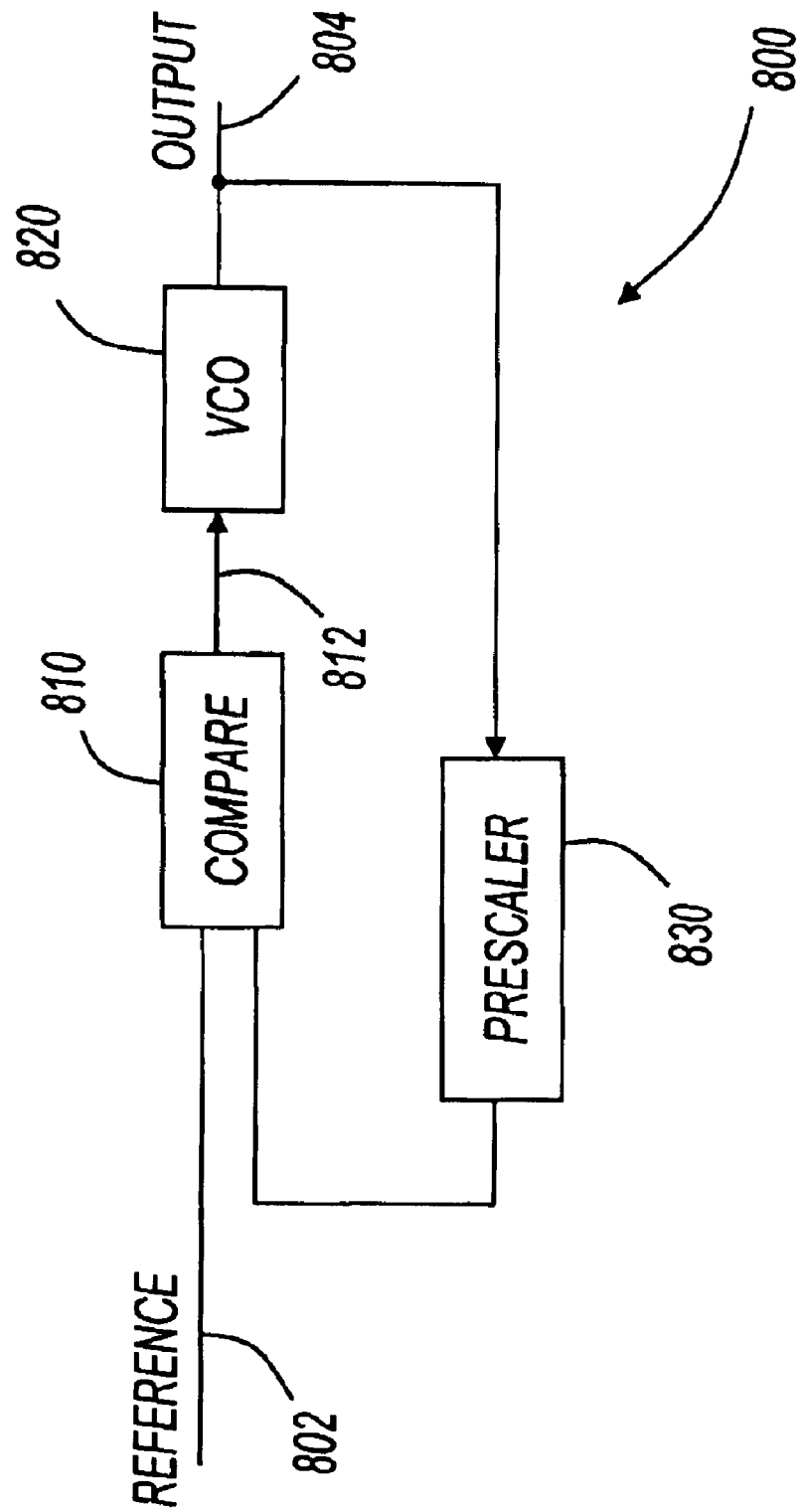
FIG. 8 shows a diagram of a frequency synthesizer.

FIG. 8 shows a diagram of a frequency synthesizer. Frequency synthesizer 800 includes voltage controlled oscillator (VCO) 820, frequency prescaler 830, and compare circuit 810. In operation, compare circuit 810 receives a reference signal on node 802, and an output signal from frequency prescaler 830. Compare circuit 810 may compare phases of the two signals or frequency of the two signals and produce a VCO control signal on node 812. VCO 820 receives the control signal on node 812, and produces an output signal on node 804.

VCO 820 may produce an output signal that is greater in frequency than the reference signal on node 802 in part because prescaler 830 divides the frequency of the output signal on node 804. Prescaler 830 may be any of the prescaler embodiments described above. For example, prescaler 830 may be prescaler 100 (FIG. 1), prescaler 500 (FIG. 5), or prescaler 600 (FIG. 6).

Figure 9:
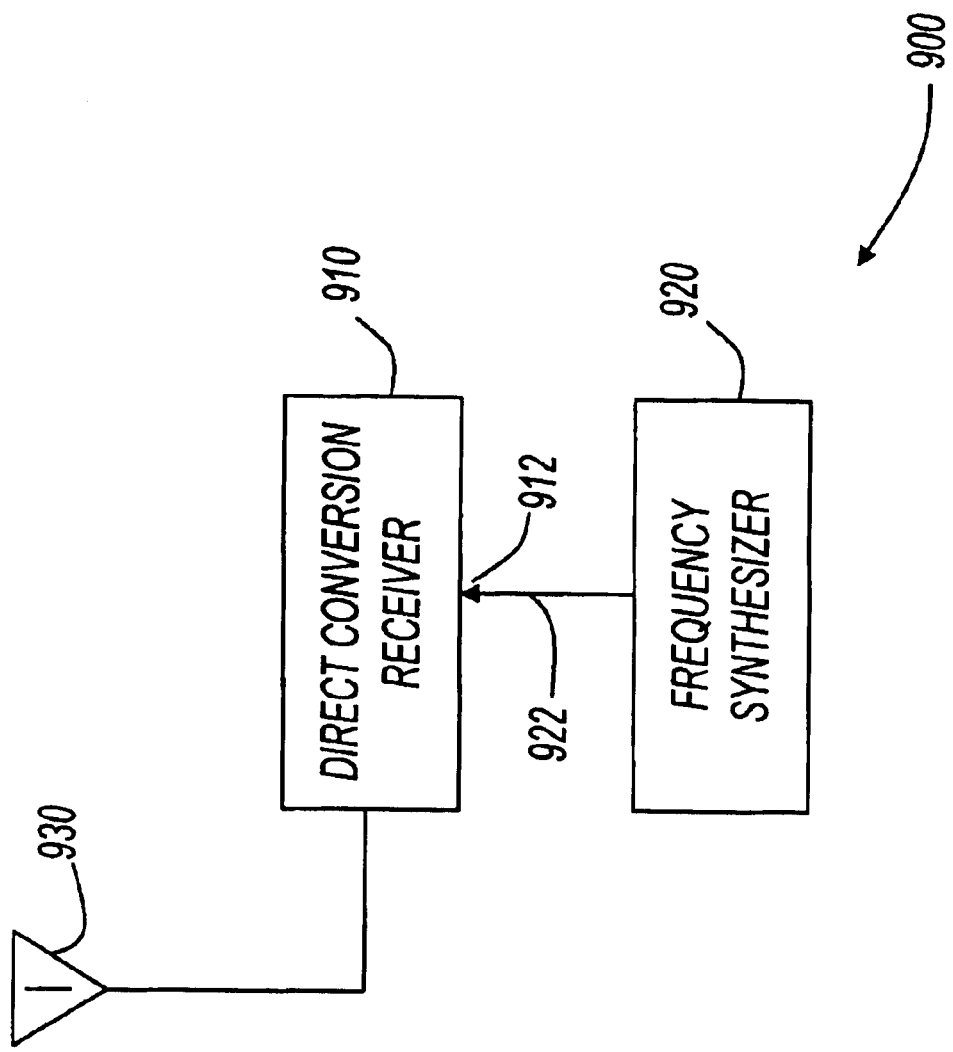
FIG. 9 shows a system diagram in accordance with various embodiments of the present invention.

FIG. 9 shows a system diagram in accordance with various embodiments of the present invention. System 900 includes frequency synthesizer 920, direct conversion receiver 910, and antenna 930. Frequency synthesizer 920 may include any of the even/odd modulus frequency prescalers described above. Further, frequency synthesizer 920 may be implemented using a circuit topology similar to that shown in FIG. 8.

Frequency synthesizer 920 may provide a local oscillator signal on node 922, and direct conversion receiver 910 may receive a local oscillator signal at oscillator input port 912. Direct conversion receiver 910 also may receive a signal from antenna 930. Direct conversion receiver 910 may utilize the local oscillator signal to "down-convert" the signal received from antenna 930 directly to baseband. Because direct conversion receiver 910 does not utilize an intermediate frequency (IF), it may also be referred to as a "zero-IF" receiver.

In some embodiments, system 900 includes a transceiver that both transmits and receives signals at antenna 930. For example, system 900 may be a cell phone with a transmitter and a receiver. Also for example, system 900 may be a wireless local area network interface that includes both a transmitter and a receiver. In some embodiments, antenna 930 may be a directional antenna, and in other embodiments, antenna 930 may be an omni-directional antenna.

Frequency synthesizers (and prescalers) may be used in systems other than systems represented by FIG. 9. For example, a frequency synthesizer may be used in a system that includes a heterodyne receiver that utilizes an intermediate frequency. Many other system uses exist for frequency synthesizers and prescalers.

Sequential elements, frequency prescalers, frequency synthesizers, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, frequency synthesizer 800 (FIG. 8) can be represented as polygons assigned to layers of an integrated circuit.

Figure 10:
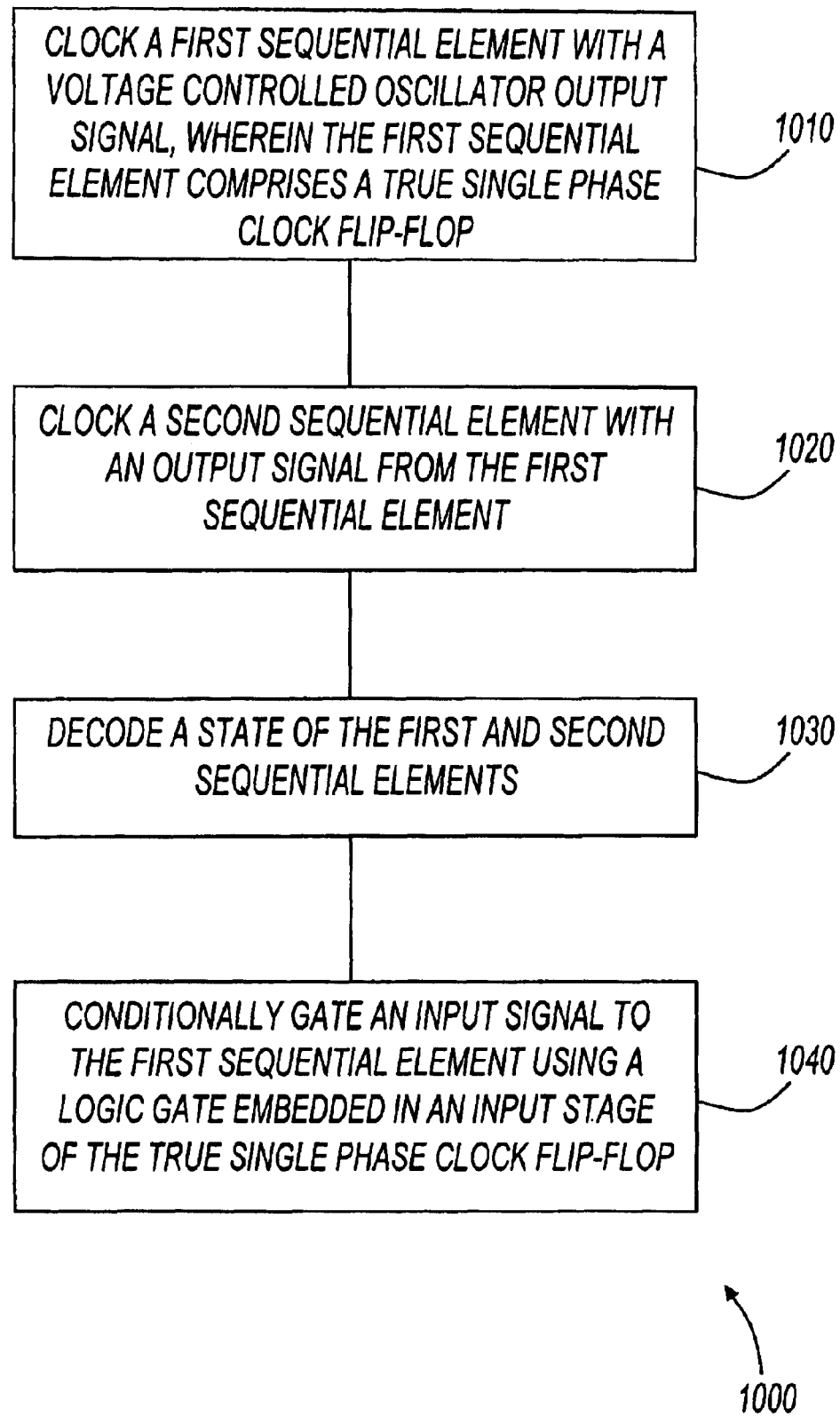
FIG. 10 shows a flowchart in accordance with various embodiments of the present invention.

FIG. 10 shows a flowchart in accordance with various embodiments of the present invention. In some embodiments, method 1000, or portions thereof, is performed by a frequency prescaler, embodiments of which are shown in previous figures. In other embodiments, method 1000 is performed by a frequency synthesizer, an integrated circuit, or an electronic system. Method 1000 is not limited by the particular type of apparatus performing the method. The various actions in method 1000 may be performed in the order presented, or may be performed in a different order. Further, in some embodiments, some actions listed in FIG. 10 are omitted from method 1000.

Method 1000 is shown beginning with block 1010 in which a first sequential element is clocked with a voltage controlled oscillator output signal, wherein the first sequential element comprises a true single phase clock flip-flop. In some embodiments, the sequential element referred to in block 1010 may be a least significant stage of an asynchronous counter in a frequency prescaler. For example, flip-flop 102 (FIGS. 1, 5) or flip-flop 602 (FIG. 6) may be clocked by a voltage controlled oscillator output signal when the frequency prescaler is included in a frequency synthesizer such as frequency synthesizer 800 (FIG. 8).

In block 1020, a second sequential element is clocked with an output signal from the first sequential element. In some embodiments, the second sequential element referred to in block 1020 may be a next most significant stage of an asynchronous counter in frequency prescaler. For example, the second sequential element may be flip-flop 104 (FIGS. 1, 5, 6).

In block 1030, a state of the first and second sequential elements is decoded. The actions of block 1030 may be provided by a flip-flop with an embedded gate, such as flip-flop 110 (FIG. 1), flip-flop 510 (FIG. 5), or flip-flop 602 (FIG. 6). In block 1040, an input signal to the first sequential element is conditionally gated using a logic gate embedded in an input stage of the true single phase clock flip-flop. For example, flip-flops 102 and 602 each conditionally gate an input using a logic gate embedded in an input stage.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A frequency prescaler comprising:
   a first sequential element having an input stage with at least one embedded logic gate;
   a second sequential element having a clock input node coupled to an output node of the first sequential element; and
   a third sequential element coupled to the output node of the first sequential element wherein the at least one logic gate is coupled to receive a signal from the output node of the first sequential element and is coupled to receive a signal from the third sequential element.

2. The frequency prescaler of claim 1 wherein the first sequential element is coupled to perform a conditional divide-by-two operation.

3. The frequency prescaler of claim 1 wherein the third sequential element is coupled to decode a state of the first and second sequential elements.

4. The frequency prescaler of claim 3 wherein the third sequential element includes at least one logic gate embedded within an input stage.

5. The frequency prescaler of claim 1 wherein the first sequential element comprises a true single phase clock flip-flop.

6. The frequency prescaler of claim 1 wherein:
   the first sequential element includes a clock input node configured to receive a voltage controlled oscillator output signal; and
   the first and second sequential elements are configured to form an asynchronous counter.

7. A frequency prescaler comprising:
   a first sequential element having an input stage with at least one embedded logic gate;
   a second sequential element having a clock input node coupled to an output node of the first sequential element, wherein the first sequential element includes a clock input node configured to receive a voltage controlled oscillator output signal, and the first and second sequential elements are configured to form an asynchronous counter; and
   a third sequential element having an output node coupled to an input node of the at least one logic gate of the first sequential element, and configured to decode a state of the asynchronous counter.

8. The frequency prescaler of claim 7 wherein the third sequential element is configured to be responsive to a control signal to conditionally lengthen a period of the asynchronous counter by one cycle of the voltage controlled oscillator output signal.

9. The frequency prescaler of claim 8 wherein the first sequential element comprises a true single phase clock flip-flop.

10. The frequency prescaler of claim 8 wherein the third sequential element comprises a true single phase clock flip-flop having an input stage with an embedded logic gate.

11. An even/odd modulus prescaler comprising:
an asynchronous counter having a least significant stage clocked by an input signal; and
a first true single phase clock flip-flop having an input stage with an embedded logic gate to decode a state of the asynchronous counter, configured to modify a modulus of the asynchronous counter between an even modulus and an odd modulus.

12. The even/odd modulus prescaler of claim 11 wherein the least significant stage of the asynchronous counter comprises a second true single phase clock flip-flop having an input stage with an embedded logic gate.

13. The even/odd modulus prescaler of claim 12 wherein the embedded logic gate of the least significant stage is coupled to receive signals from an output node of the least significant stage and from the first true single phase clock flip-flop.

14. The even/odd modulus prescaler of claim 13 wherein the asynchronous counter further comprises a more significant stage having a clock input node coupled to the output node of the least significant stage.

15. The even/odd modulus prescaler of claim 11 wherein the asynchronous counter comprises at least one additional more significant stage, wherein each of the at least one additional more significant stage is configured to be clocked by a lesser significant stage.

16. A frequency synthesizer comprising:
a comparison circuit to compare a reference signal and a frequency divided signal;
a voltage controlled oscillator to synthesize an output signal in response to the comparison circuit; and
a prescaler coupled to the voltage controlled oscillator to divide a frequency of the output signal, wherein the prescaler includes an asynchronous divider with at least one true single phase clock flip-flop having embedded logic in an input stage, and wherein the at least one true single phase clock flip-flop includes:
a least significant flip-flop coupled to be clocked by the output signal, the least significant flip-flop including an input stare having an embedded logic gate;
a more significant flip-flop coupled to be clocked by a signal produced by the least significant flip-flop; and
a decoder flip-flop to decode a state of the least significant flip-flop and the more significant flip-flop.

17. The frequency synthesizer of claim 16 wherein the decoder flip-flop comprises a true single phase clock flip-flop having an embedded logic gate to decode the state.

18. The frequency synthesizer of claim 16 wherein the decoder flip-flop is configured to be clocked by the output signal.

19. An electronic system that includes a direct conversion receiver with an oscillator input port, a directional antenna coupled to the direct conversion receiver, and a frequency synthesizer coupled to the oscillator input port, the frequency synthesizer comprising:
a comparison circuit to compare a reference signal and a frequency divided signal;
a voltage controlled oscillator to synthesize an output signal in response to the comparison circuit; and
a prescaler coupled to the voltage controlled oscillator to divide a frequency of the output signal, wherein the prescaler includes an asynchronous divider with at least one true single phase clock flip-flop having embedded logic in an input stage to decode a state of the asynchronous divider and to modify a modulus of the asynchronous divider between an even modulus and an odd modulus.

20. The electronic system of claim 19 wherein the at least one true single phase clock flip-flop includes a least significant flip-flop coupled to be clocked by the output signal, the least significant flip-flop including an input stage having an embedded logic gate.

21. The electronic system of claim 20 wherein the at least one true single phase clock flip-flop further includes a more significant flip-flop coupled to be clocked by a signal produced by the least significant flip-flop.

22. A method comprising:
clocking a first sequential element with an input signal, wherein the first sequential element comprises a true single phase clock flip-flop;
clocking a second sequential element with an output signal from the first sequential element;
decoding a state of the first and second sequential elements; and
conditionally gating an input signal to the first sequential element using a logic gate embedded in an input stage of the true single phase clock flip-flop.

23. The method of claim 22 wherein decoding comprises receiving output signals from the first and second sequential elements at a logic gate embedded in an input stage of a third sequential element.

24. The method of claim 23 further comprising clocking the third sequential element with the input signal.

25. The method of claim 22 wherein clocking a first sequential element with an input signal comprises clocking the first sequential element with a voltage controlled oscillator output signal.

* * * * *